US010237973B2

(12) United States Patent
Tokoro

(10) Patent No.: US 10,237,973 B2
(45) Date of Patent: Mar. 19, 2019

(54) MULTILAYER WIRING SUBSTRATE

(71) Applicant: CANON KABUSHIKI KAISHA, Tokyo (JP)

(72) Inventor: Takashi Tokoro, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/944,626

(22) Filed: Apr. 3, 2018

(65) Prior Publication Data

US 2018/0295721 A1 Oct. 11, 2018

(30) Foreign Application Priority Data

Apr. 10, 2017 (JP) ................................. 2017-077271

(51) Int. Cl.
| | | |
|---|---|---|
| H05K 1/11 | (2006.01) | |
| H05K 1/02 | (2006.01) | |
| H05K 3/42 | (2006.01) | |
| H01R 13/6471 | (2011.01) | |
| H05K 3/46 | (2006.01) | |
| H05K 3/34 | (2006.01) | |

(52) U.S. Cl.
CPC ....... *H05K 1/0298* (2013.01); *H01R 13/6471* (2013.01); *H05K 1/115* (2013.01); *H05K 3/429* (2013.01); *H05K 3/4626* (2013.01); *H05K 3/3447* (2013.01); *H05K 2201/09536* (2013.01); *H05K 2201/09627* (2013.01)

(58) Field of Classification Search
CPC ...... H05K 3/3447; H05K 3/308; H05K 3/306; H05K 1/115; H05K 3/3421; H05K 1/0222
See application file for complete search history.

(56) References Cited

U.S. PATENT DOCUMENTS

| 4,628,409 | A | * | 12/1986 | Thompson | ............. | H05K 1/115 |
|---|---|---|---|---|---|---|
| | | | | | | 228/180.1 |
| 2002/0101723 | A1 | * | 8/2002 | Bertin | ............... | H01L 21/76898 |
| | | | | | | 361/736 |
| 2005/0230813 | A1 | * | 10/2005 | Nakamura | ........... | H05K 1/0222 |
| | | | | | | 257/698 |
| 2008/0173472 | A1 | * | 7/2008 | Takizawa | ............... | H05K 1/116 |
| | | | | | | 174/260 |
| 2010/0176896 | A1 | * | 7/2010 | Payne | ..................... | H01P 5/085 |
| | | | | | | 333/33 |

FOREIGN PATENT DOCUMENTS

JP 2005183649 A 7/2005

* cited by examiner

*Primary Examiner* — Steven T Sawyer

(74) *Attorney, Agent, or Firm* — Canon U.S.A., Inc. IP Division

(57) ABSTRACT

Signal transmission characteristics in a case where a conductive pin is inserted into a through hole to perform connection with an external circuit are improved. A multilayer wiring substrate includes a front layer and a rear layer, and includes a plurality of layers in an inner layer. A conductive portion is provided in each of the layers, and a wiring is disposed on the rear layer. The conductive pin for connection with the external circuit is inserted into the through hole. A land is disposed around the through hole on the rear layer, and the land and the conductive pin are connected to each other through solder.

13 Claims, 4 Drawing Sheets

MULTILAYER WIRING SUBSTRATE

BACKGROUND

Field of the Disclosure

The present disclosure relates to a multilayer wiring substrate, and more specifically, to a multilayer wiring substrate connected to an external circuit through a through hole and a conductive pin.

Description of the Related Art

In recent years, a transmission rate of an interface with an external device is increased, and the transmission rate of 12 Gbps has been practically used in a serial digital interface (SDI). To accurately transmit a high-speed signal exceeding 10 GHz, appropriate adjustment or setting of an impedance of a transmission line between a signal transmitter side and a signal receiver side is important. The transmission line includes a cable, a connector, and a substrate wiring. In high-speed interface standards, characteristic impedance and return loss of the substrate are specified, and it is necessary to perform design minimally satisfying the standards.

A configuration in which a connector to be mounted on a substrate is used as a surface mount device (SMD) in order to suppress the characteristic impedance mismatching between the connector and the substrate wiring is known. The configuration has an issue of strength because a core wire is moved in response to insertion or removal of the cable due to the connector structure. In contrast, a configuration in which the connector is used as an insertion component as with in low-speed transmission is also well-known. In this configuration, adjustment of a single component by a component manufacturer and adjustment of a through hole by a substrate manufacturer are necessary in order to adjust impedance of a conductive pin to be connected to the substrate, and it is therefore extremely difficult to obtain impedance matching.

As a method of reducing impedance mismatching in the through hole of the multilayer wiring substrate, a configuration in which a hole is opened at a stub of the through hole with use of a drill to remove a parasitic capacitance of the stub of the through hole is known.

In addition, a configuration in which two through holes are provided side by side and are connected to each other at both ends or one ends of the respective through holes, to correct deviation of impedance at the stub of the through hole, is known (e.g., refer to Japanese Patent Application Laid-Open No. 2005-183649).

In a case where processing is performed with use of the drill in manufacturing of the substrate, a processing process is added, which results in cost increase.

In the technology disclosed in Japanese Patent Application Laid-Open No. 2005-183649, impedance adjustment is performed on the assumption that a conductive portion of the through hole and the conductive pin inserted into the through hole ideally engage with each other. The conductive pin and the through hole, however, engage with each other only at a solder connection part, and the engagement becomes unstable depending on a connection state of the solder. At this time, the impedance matching is not completely performed.

SUMMARY

According to an aspect of the present disclosure, a multilayer wiring substrate includes a through hole into which a conductive pin is insertable. The through hole penetrates through a plurality of layers each including a conductive portion. The multilayer wiring substrate includes a land on a rear layer out of the plurality of layers. The land includes a conductive material surrounding around the through hole, and is soldered to the conductive pin that is inserted into the through hole.

Further features of the present disclosure will become apparent from the following description of exemplary embodiments with reference to the attached drawings.

DESCRIPTION OF THE EMBODIMENTS

An exemplary embodiment of the present disclosure will be described in detail below with reference to drawings.

Figure 1:
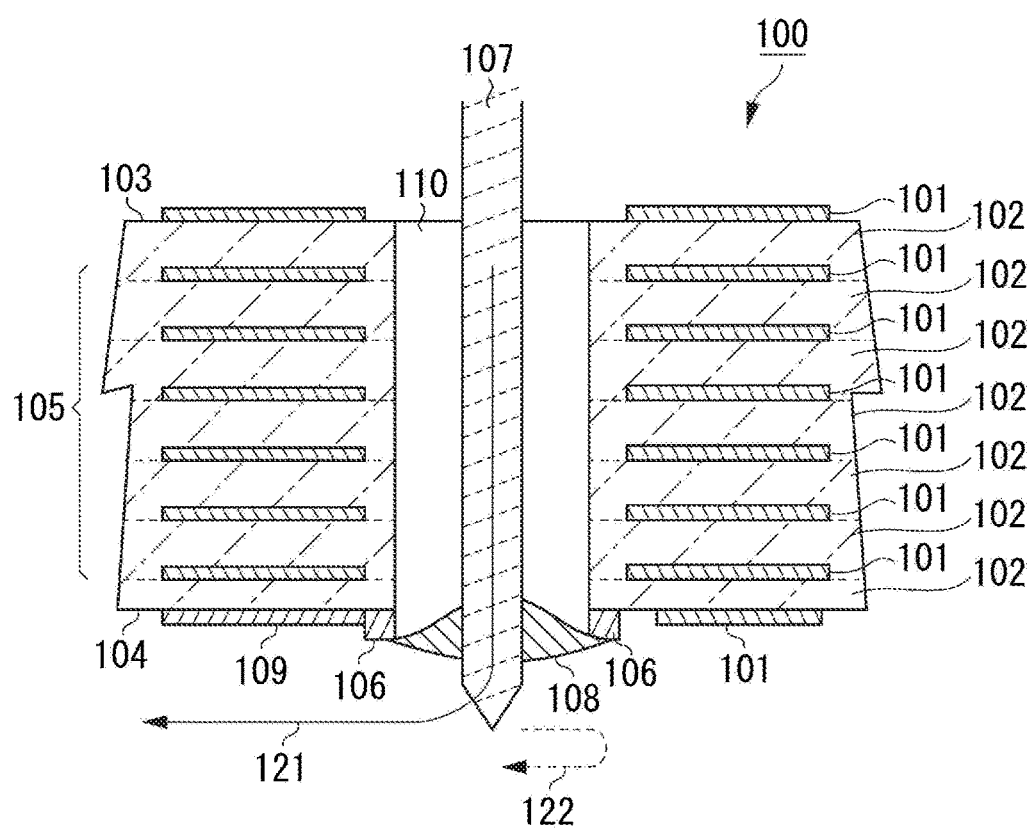
FIG. 1 is a vertical cross-sectional view of an exemplary embodiment of the present disclosure.

FIG. 1 is a cross-sectional view of a multilayer wiring substrate according to the exemplary embodiment of the present disclosure.

A multilayer wiring substrate 100 has a configuration in which conductive portions (electric wiring layers) 101 and insulation portions (insulation layers) 102 are alternately stacked. Each of a front layer 103 and a rear layer 104 of the substrate 100 includes the conductive portion in which an electronic circuit is installable. The conductive portions 101 and the insulation portions 102 are disposed in an inner layer 105 sandwiched between the front layer 103 and the rear layer 104. The conductive portions 101 are individually connected to a power source of the multilayer wiring substrate 100 and the ground, and each include a copper foil that transmits a signal. The insulation portions 102 each include an insulation material such as prepreg or a core material.

A through hole 110 that penetrates from the front layer 103 to the rear layer 104 is opened in the substrate 100. A conductive pin 107 is insertable into the through hole 110. The conductive pin 107 realizes electric connection between any of an unillustrated external circuit, the front layer 103, the rear layer 104, and the plurality of conductive portions 101. The conductive portions to be connected to each other by the conductive pin 107, or the conductive portion to be connected to the external circuit by the conductive pin 107 depends on an application.

As a description example, the conductive pin 107 is inserted into the through hole 110 in order to electrically connect the external circuit and a wiring 109 of the rear layer 104 to each other. A land 106 is provided in a ring shape for electrical connection between the conductive pin 107 and the wiring 109 of the rear layer 104. The land 106 is provided close to the through hole 110 and the wiring 109 of the rear layer 104 and surrounds around the through hole 110.

To electrically connect the conductive pin 107 to the wiring 109 of the rear layer 104, a gap between the land 106 and the conductive pin 107 is filled with solder 108. A high-speed signal of about 12 Gbps is supplied to a circuit device on the wiring 109 from the unillustrated external circuit connected to the conductive pin 107. Most signal component 121 of the high-speed signal passes through the side of the solder 108 close to the circuit device and then enters the circuit device as illustrated by a solid arrow. A remaining signal component 122 is reflected on the side of the solder 108 separated from the circuit device and then flows into the circuit device as illustrated by a dashed arrow. Each of the signal components 121 and 122 is a traveling wave, and the reflected signal component 122 causes wavelength deterioration with respect to the signal component 121 that directly enters the circuit device. Providing the land 106 allows for increase of effective cross-sectional area of a transmission path through which the signal component 122 passes. As a result, the reflected signal component 122 becomes relatively small and delay caused by reflection is small as well, which lowers the deterioration degree of the waveform.

A method of matching impedance near the conductive pin 107 with use of a coaxial line will be described with reference to FIG. 2, FIG. 3, and FIG. 4. The conductive pin 107 functions as a core of the coaxial line in the through hole 110. Further, although detail is described later, parameters of the coaxial line are adjusted between the rear layer 104 and both of the front layer 103 and the inner layer 105 to achieve impedance matching.

Figure 2:
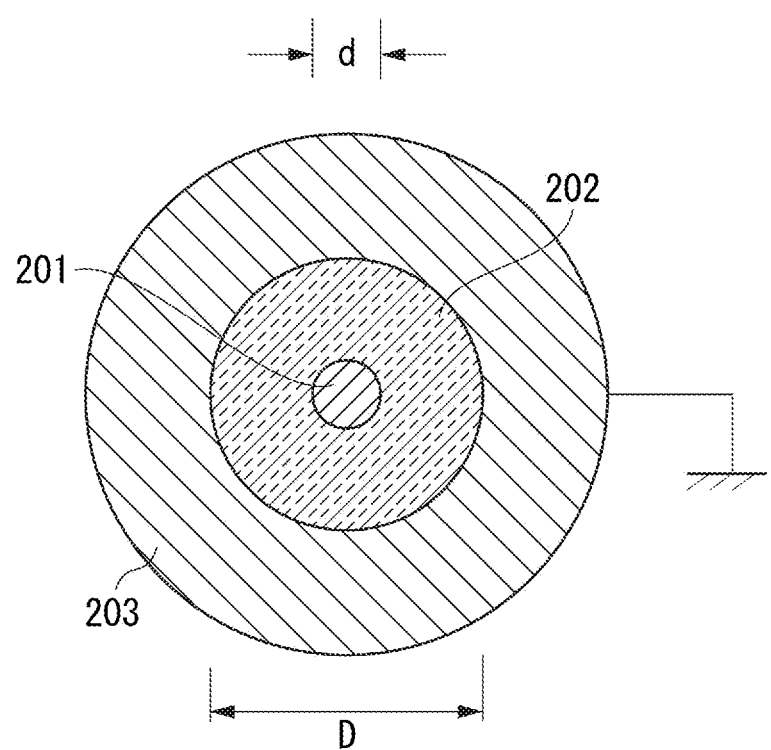
FIG. 2 is a cross-sectional view to explain a coaxial line, according to one or more exemplary embodiments of the present disclosure.

FIG. 2 is a cross-sectional view of the coaxial line. The coaxial line has a configuration in which an internal conductor 201 as a core is inserted into a cylindrical part provided in an external conductor 203 and a non-conductive portion 202 such as a dielectric is inserted between the internal conductor 201 and the external conductor 203. The external conductor 203 is connected to a fixed potential, e.g., the ground or the earth. Characteristic impedance $Z_0$ of the coaxial line is determined by an outer diameter d of the internal conductor 201, an inner diameter D of the external conductor 203, and a relative permittivity $\varepsilon_r$ of the non-conductive portion 202. The external conductor 203 is formed by applying or attaching, to the insulation layer 102, a conductive material in a ring shape at a position separated from the conductive pin 107 by a predetermined distance in a radial direction on each of the front layer 103, the rear layer 104, and the inner layer 105. The characteristic impedance $Z_0$ is calculated by the following equation, $$Z_0 = (138/\varepsilon_r^{1/2})\log_{10}(D/d)$$

Figure 3:
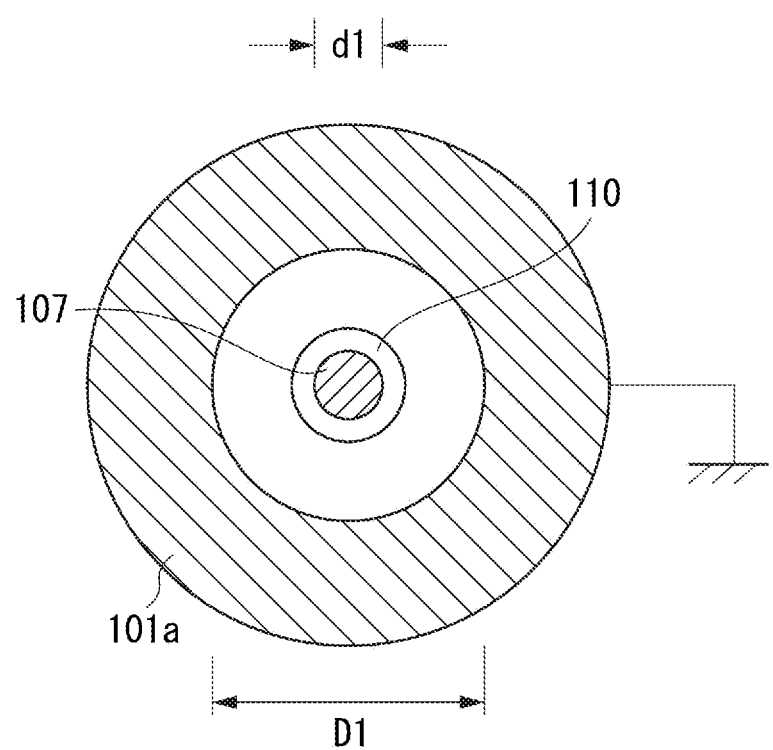
FIG. 3 is a cross-sectional view of a portion of a front layer and an inner layer of an exemplary embodiment of the present disclosure.
Figure 4:
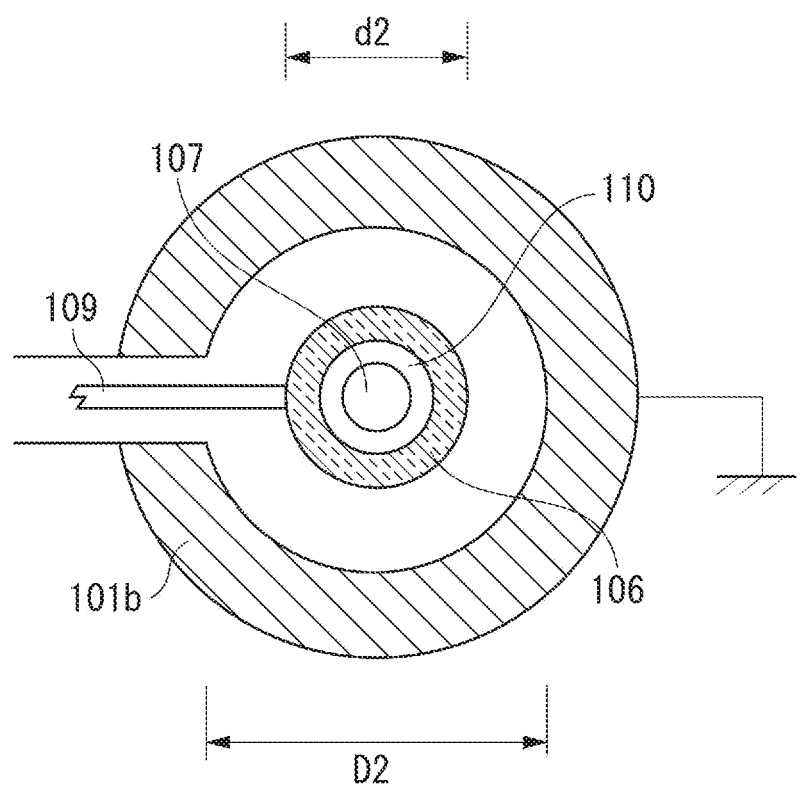
FIG. 4 is a plan view of a rear layer of an exemplary embodiment of the present disclosure, as viewed from the rear side.

A coaxial line structure having a shape illustrated in FIG. 3 is adopted for the front layer 103 and the inner layer 105, and a coaxial line structure having a shape illustrated in FIG. 4 is adopted for the rear layer 104. In any of the structures of FIG. 3 and FIG. 4, the non-conductive portion 202 having a thickness described later is provided outside the through hole 110, and a conductor corresponding to the external conductor 203 is provided outside the non-conductive portion 202 in the substrate 100. In FIG. 3, the outer diameter of the conductive pin 107 corresponds to the outer diameter of the internal conductor 201 that is denoted by d1 in this case. The inner diameter of the external conductor 203 is denoted by D1. In FIG. 4, the outer diameter of the land 106 connected to the conductive pin 107 through the solder corresponds to the outer diameter of the internal conductor 201 that is denoted by d2 in this case. The inner diameter of the external conductor 203 is denoted by D2. Relationship of d1<d2 is established due to presence of the land 106. To eliminate or reduce impedance mismatching caused thereby, relationship D1<D2 is established in the present exemplary embodiment.

Numerical examples are described. In a case where a connection inter face is a serial digital interface (SDI), the characteristic impedance is 75Ω. In a case where an epoxy resin is used for the non-conductive portion 202, a relative permittivity thereof is 4.1. The diameter of the conductive pin 107 is set to 0.5 mm, and the diameter of the land 106 is set to 1.0 mm. The numerical examples are appropriately variable depending on an application.

The front layer 103 and the inner layer 105 each have the coaxial line structure illustrated in FIG. 3 and the outer diameter d1 of the internal conductor 201 is 0.5 mm. To obtain the characteristic impedance $Z_0$ of 75Ω with the parameter values, it is sufficient to set the inner diameter D1 of the external conductor 203 to 6.28 mm. At this time, the width of the non-conductive portion 202 becomes 2.89 mm from (6.28-0.5)/2. In other words, a ring 101a of the conductive material having the inner diameter of 6.28 mm that becomes the external conductor 203 is applied to each of the conductive portions 101 on the front layer 103 and the inner layer 105. The ring 101a of the conductive material is connected to the earth or the ground. In a case where an allowable range of the characteristic impedance is set to 75 Ω±10%, the width of the non-conductive portion 202 is set to 2.89±15%. The allowable range at this time includes a manufacturing error of each of the conductive pin 107 and the multilayer wiring substrate 100.

In contrast, the rear layer 104 has the coaxial line structure illustrated in FIG. 4, and the conductive pin 107 is connected to the land 106 through the solder 108. Accordingly, the outer diameter of the internal conductor 201 is equal to the outer diameter of the land 106, i.e., the outer diameter d2 of the internal conductor 201 is 1.0 mm. To obtain the characteristic impedance $Z_0$ of 75Ω with the parameter values, it is sufficient to set the inner diameter D2 of the external conductor 203 to 12.57 mm. At this time, the width of the non-conductive portion 202 becomes 5.79 mm from (12.57-1.0)/2. In other words, a ring 101b of the conductive material having the inner diameter 12.57 mm that becomes the external conductor 203 is applied on the rear layer 104. The ring 101b of the conductive material is connected to the earth or the ground. In the case where the allowable range of the characteristic impedance is set to 75 δ2±10%, the width of the non-conductive portion 202 is set to 5.79 mm±15%. The allowable range at this time includes a manufacturing error of each of the conductive pin 107 and the multilayer wiring substrate 100.

As described above, the ring-shaped land that is soldered to the conductive pin is provided on the rear layer of the substrate, which makes it possible to reduce multiple reflection by the stub. In addition, the ring-shaped conductive material connected to the ground or the earth is disposed separately from the conductive pin by the predetermined distance in the radial direction, on each of the layers of the multilayer wiring substrate, and the distance between the conductive pin and the ring-shaped conductive material is adjusted so as to achieve the predetermined impedance value in the longitudinal direction of the conductive pin. This makes it possible to reduce impedance mismatching. Correcting the shape of each of the land 106 and the rings 101a and 101b also makes it possible to reduce the parasitic capacitance and the impedance mismatching.

Although the preferred exemplary embodiment of the present disclosure has been described, the present disclosure is not limited to the exemplary embodiment, and various modifications and changes may be made within the scope of the present disclosure.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-077271, filed Apr. 10, 2017, which is hereby incorporated by reference herein in its entirety.

What is claimed is:

1. A multilayer wiring substrate that includes a through hole into which a conductive pin is insertable, the through hole penetrating through a plurality of layers each including a conductive portion, the multilayer wiring substrate comprising:
    a ring-shaped land on a rear layer out of the plurality of layers, the land including a conductive material surrounding around the through hole, and being soldered to the conductive pin that is inserted into the through hole;
    a first ring-shaped conductive portion on a layer other than the rear layer out of the plurality of layers, the first ring-shaped conductive portion surrounding around the through hole; and
    a second ring-shaped conductive portion on the rear layer, the second ring-shaped conductive portion surrounding around the land,
    wherein a conductive layer is not formed on a side surface of the through hole, and
    wherein the following relationship is established $$D1<D2$$

where $D1$ is an inner diameter of the first ring-shaped conductive portion and $D2$ is an inner diameter of the second ring-shaped conductive portion.

2. The multilayer wiring substrate according to claim 1, wherein the land is not disposed on layers other than the rear layer, out of the plurality of layers.

3. The multilayer wiring substrate according to claim 1, wherein the second ring-shaped conductive portion is configured to become an external conductor of a coaxial line having predetermined characteristic impedance within a predetermined allowable range when the land serves as an internal conductor of the coaxial line; and
    wherein the first ring-shaped conductive portion is configured to become an external conductor of the coaxial line having the predetermined characteristic impedance within the predetermined allowable range when the conductive pin serves as an internal conductor of the coaxial line.

4. The multilayer wiring substrate according to claim 3, wherein the predetermined characteristic impedance $Z_0$ is calculated from the following equation, in the coaxial line, $$Z_0=(138/\varepsilon_r^{1/2})\log_{10}(D/d)$$

where $d$ is an outer diameter of the internal conductor, $D$ is an internal diameter of the external conductor, and $\varepsilon_r$ is a relative permittivity of a non-conductive portion between the internal conductor and the external conductor.

5. The multilayer wiring substrate according to claim 3, wherein the predetermined characteristic impedance is 75 $\Omega \pm 10\%$.

6. The multilayer wiring substrate according to claim 3, wherein the predetermined allowable range is an error of 25%.

7. The multilayer wiring substrate according to claim 3, wherein the following relationship is established, $$d1<d2$$

where $d1$ is an outer diameter of the conductive pin and $d2$ is an outer diameter of the land.

8. The multilayer wiring substrate according to claim 1, wherein the side surface of the through hole includes a surface of a non-conductive material.

9. The multilayer wiring substrate according to claim 8, wherein the non-conductive material is disposed between the conductive pin and the first ring-shaped conductive portion.

10. The multilayer wiring substrate according to claim 9, wherein the non-conductive material is an epoxy resin.

11. The multilayer wiring substrate according to claim 1, wherein a signal exceeding 10 GHz is supplied through the conductive pin.

12. The multilayer wiring substrate according to claim 1, wherein
    the plurality of layers includes the rear layer, a front layer, and an inner layer between the rear layer and the front layer, and
    the first ring-shaped conductive portion is disposed on the inner layer.

13. The multilayer wiring substrate according to claim 1, wherein
    the plurality of layers includes the rear layer, a front layer, and an inner layer between the rear layer and the front layer, and
    the first ring-shaped conductive portion is disposed on the front layer.

* * * * *